United States Patent [19]

Pizzuti et al.

[11] 4,134,062

[45] Jan. 9, 1979

[54] LIMITED ROTATION INSTRUMENT REBALANCE APPARATUS EMPLOYING A WIPER HAVING VIBRATION DAMPING

[75] Inventors: Everett V. Pizzuti, Exeter; David M. Gaskill, Jr., Providence, both of R.I.

[73] Assignee: Atlan-Tol Industries, Inc., West Warwick, R.I.

[21] Appl. No.: 882,287

[22] Filed: Feb. 28, 1978

[51] Int. Cl.² .................... G01R 1/14; G01R 17/06
[52] U.S. Cl. .......................... 324/125; 324/99 R; 346/32
[58] Field of Search .............. 324/99 R, 100, 125; 73/430; 346/32

[56] References Cited

U.S. PATENT DOCUMENTS

| 2,569,311 | 9/1951 | Hoare et al. | 324/125 |
|---|---|---|---|
| 3,340,536 | 9/1967 | Sauber | 346/32 |

*Primary Examiner*—Rudolph V. Rolinec
*Assistant Examiner*—Ernest F. Karlsen
*Attorney, Agent, or Firm*—Salter & Michaelson

[57] ABSTRACT

A recording device which utilizes a closed loop servo system including a limited rotation motor, i.e. a moving coil galvanometer wherein the moving coil is activated by an input signal such that the rotational movement of a shaft supporting such coil may be translated into a graphic display for recording of the input signal. The device has specific utility in the recording of medical information wherein the input signal is created by the patient's body functions but has widespread alternate utility. The device further includes a transducer construction utilizing a rotational resistance mechanism including a rotating hub to which a contact arm is attached that creates a signal proportional to the position of the coil shaft and utilizes this signal for comparison with the input signal such that the coil position and thus that of the shaft may be corrected. Any mechanical or electrical vibration in the resistance element is prevented or reduced by the use of a viscous dampening material disposed between the hub and contact arm of the rotational resistance mechanism.

10 Claims, 4 Drawing Figures

LIMITED ROTATION INSTRUMENT REBALANCE APPARATUS EMPLOYING A WIPER HAVING VIBRATION DAMPING

BACKGROUND AND SUMMARY OF THE INVENTION

For many years limited rotation motor devices of various types have been used. Some utilize the principle of a moving coil of the d'Arsonval type while others utilize the principle of a moving iron. One function of these limited rotation motors is to move a stylus or pen. Others are used in conjunction with a mirror or laser to deflect a beam of light as in a high speed oscillograph or with various types of office copying machines. In all of these devices there exists the need to enhance accuracy and to control "overshoot" when a transient signal is applied to the device.

Accuracy may be enhanced by means of the addition of a closed loop servo transducer and appropriate electronic circuitry. In these closed loop servo systems a transducer is used to sense the position of the rotor of the limited rotation motor. Transducers such as strain gages, linear variable transformers, capacitors and variable resistors are used and some of the disadvantages of these methods are as follows: Linear variable differential transformers are generally bulky and they require an excitation signal; moreover they rely for accuracy on the linearity of a spring system. Strain gages require additional circuitry and they are difficult to calibrate and balance and are affected by temperature changes. Capacitor type transducers rely on an air gap which is subject to contamination; they require extensive circuitry to calibrate and balance and they are subject to temperature variations. Recent improvements in the materials used to manufacture variable resistors, make them good potential transducer devices but they are difficult to construct so as to be free from non-linearity and are subject to vibrations generated between the pick-off element and the resistive material.

The present invention describes an improved limited rotation motor utilizing a variable resistive transducer mechanism in a closed loop servo system. Specifically the invention relates to a closed loop servo system in which a moving coil galvanometer is utilized. The invention as such has particular utility as the drive mechanism for a recording chart wherein an electrical input from the source such as the vital signs of a medical patient is translated into a graphic record. Obviously, other than medical information may be recorded, however, such has particular applicability to the present invention.

A particularly desirable motor movement for the translation of such input signals into usable mechanical movements is that based on the d'Arsonval principle in which a moving coil of a galvanometer enables limited rotation to be effected such that a heated stylus or other such device attached to the supporting shaft of such moving coil may translate such limited rotational movement into a permanent chart recording. A publication (copy attached) generally describing this and other type motor movements is entitled "Chart Recorders" and found on pages 44–46 and 49 of New Electronics (Mar. 5, 1974). A problem with the use of such device is, however, that the input signal to the coil which in effect moves the coil in the above-discussed limited rotational manner, inherently causes the coil to rotate a greater or lesser distance than the proportional strength of the input signal due to its mechanical inertia. In order to overcome this effect, it is possible to have the coil operate against a spring load, however, such springs introduce forces which must be initially overcome and further have a tendency not to restore the coil to its proper position, and thus may create a back-and-forth vibrational type effect before damping the correct position of the coil which is truly representative of the input signal is arrived at.

In order to eliminate such problem, a servo feedback or null circuit may be utilized. Therein a contact arm connected to a hub in turn connected to the shaft of the moving coil and accordingly movable therewith may be used to create a feedback signal proportional to the physical position of the arm vis-a-vis a resistance track representative of the full travel range of such coil. The feedback or correction created from such contact between the arm and resistance track is then compared with the input voltage and correction of the rotational position of the shaft immediately and continuously made. The manner in which such arm moves can, however, cause inaccuracies by introducing undesirable transients into the system.

Accordingly, a primary object of the present invention is the provision of a closed loop servo system utilizing a rotational resistance element as the feedback sensing device of a galvanometer and which is not subject to undesirable effects such as mechanically or electrically induced transients.

These and other objects of the present invention are achieved by the provision of a closed loop servo system including a galvanometer having a shaft mounted coil arcuately movable within maximum rotational limits through a magnetic field by means of a driving input signal thereto. A hub connected to the shaft of the moving coil and in turn rotatable therewith supports a spring biased contact arm which is adapted to move across a resistance track representative of the total possible coil movement. The movement creates the feedback signal which is compared with the input signal so as to rapidly determine whether or not the input signal has moved the coil to its proper position. Viscous damping material is introduced between the connection area of the arm to the hub such that this material creates a viscous dampening effect thereon so as to eliminate or reduce undesirable vibrational movement of the contact arm.

Other objects, features and advantages of the invention shall become apparent as the description thereof proceeds when considered in connection with the accompanying illustrative drawing.

DESCRIPTION OF THE DRAWING

In the drawing which illustrates the best mode presently contemplated for carrying out the present invention.

DESCRIPTION OF THE INVENTION

Figure 1:
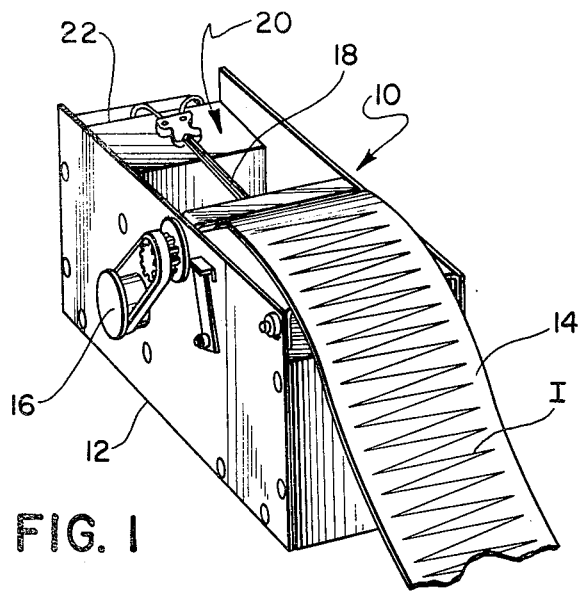
FIG. 1 is a perspective view of a chart recorder utilized to record medical or other information and which utilizes the present invention as the means for driving the recording stylus therein shown.

Turning now to the drawing and particularly FIG. 1 thereof, a recording device 10 is shown such as may be used to translate electrical signals into a mechanical indication such as a written graphic display. Such mechanical indication need not however be a graphic display, i.e. it could be used to reflect light as by deflection of a light beam by a mirror as in copy machines and photographic recorders or to regulate valve mechanisms. The graphic displays include pen and ink as well as heated stylus recorders.

In the device illustrated, a frame 12 supports a supply of paper 14 and drive means 16 for moving such paper past and in contact with a heated stylus 18. As will hereinafter be more fully brought out, the stylus 18 is suitably connected to the drive unit 20 of the present invention. Such unit 20 includes a container 22 which in turn houses an amplifier (not shown) which amplifies an input signal Vr, a limited rotation motor in the form of a galvanometer 24 having a moving coil or winding transducer means 26 and comparative means 28.

Figure 4:
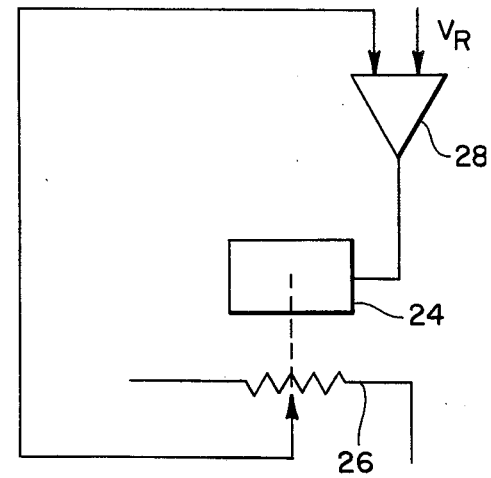
FIG. 4 is a circuit diagram showing the manner in which the present invention operates.

Accordingly, and as best explained by reference to FIG. 4 of the drawing, an input signal Vr, i.e. from a medical patient and representative of a heart beat, brain wave, etc. is initially amplified and then directed to the moving coil of the galvanometer 24 so as to cause the supporting shaft thereof to create an electrical feedback signal Vf in the transducer 26. The feedback signal may be compared with the input signal by means of a comparator 28, thus assuring that the movement of the coil is, in fact, representative of the input signal, that is, represents a movement proportional to the actual magnitude of such input signal and not incorrectly representative of a position thereof caused by an inertial override or the like.

The galvanometer 24 shown is a limited rotation moving coil device incorporating the d'Arsonval movement. Accordingly, the galvanometer 24 includes a stator 30 assembled from a plurality of magnetically permeable laminations (not visible). The stator 30 thus forms a supporting structure for the galvanometer 24 and is provided with mounting tabs 34 on either side thereof so that the galvanometer 24 may be suitably attached to the frame 12 as by means of bolts (not shown) fitted through the openings 34 thereof. The limited rotation motor need not be a moving coil galvanometer, but may take other forms such as a moving iron galvanometer in which case the coil or winding remains fixed relative to the supporting structure and the iron (magnet) moves.

Turning back to the drawing, the opposed flat vertical faces of the stator 30 provide support for a pair of crossbars 38 which are suitably interconnected to each other by means of posts 40. The crossbars 38 in turn support a permanent magnet 42 about which a moving coil 44 is adapted to rotate within the limited confines provided therefor, that is, back-and-forth within the magnetic field created in the space 46 wherein the stator and magnet are disposed in closely spaced opposition to each other. The arcuate movement of the coil 44 is controlled by stops (not shown) generally corresponding to the distance between insulators 48 shown on either side of the structure.

Figure 2:
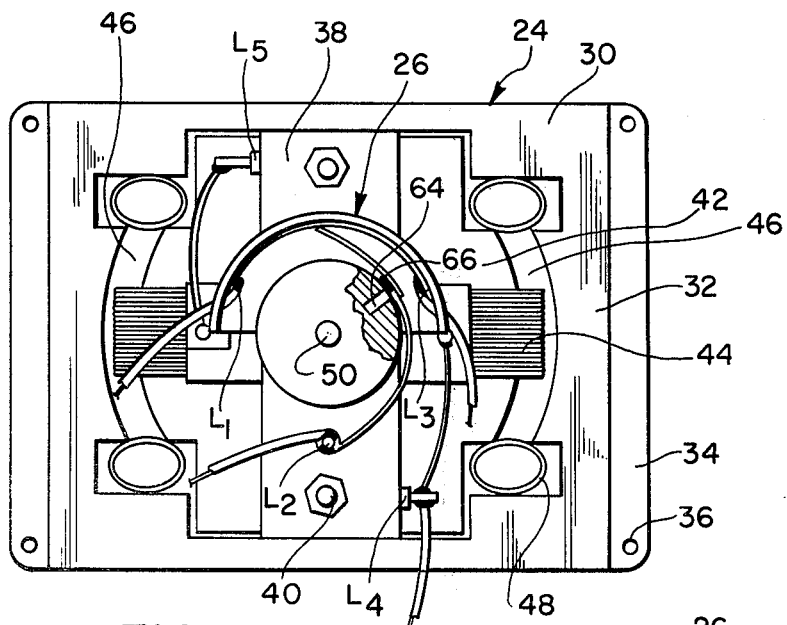
FIG. 2 is a top plan view on an enlarged scale of the stylus driving mechanism utilized in the recorder as shown in FIG. 1.
Figure 3:
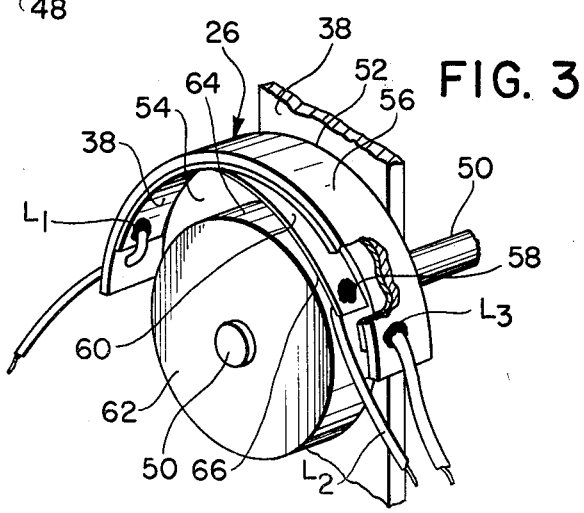
FIG. 3 is an enlarged perspective view of a portion of the rotary resistance element shown in FIG. 2

A shaft 50 rotationally supports the coil 44 and permits such above explained movement. In this regard, wire leads L4 and L5 are suitably connected to the coil such that the input voltage Vr will induce movement of the coil 44 in either direction of rotation dependent upon its polarity and its strength, that is, its value proportional to that voltage required to move the coil to the full extent of its rotational limits. Thus, upon excitation by the input voltage, the coil will move away from its rest position shown in FIG. 2 to a new position which in turn causes the shaft 40 to simultaneously rotate. The thus created rotational movement of the shaft 50 is then translated by known means (not shown) to cause the stylus 18 to move across the surface of the paper sheet 14. Generally the stylus is heated and the paper provided with a head sensitive coating such that indicia I representative of the input voltage over a particular time increment is created. As previously indicated other mechanical indications may also be activated by the above-described movement. Also, this movement may be accomplished by movement of the rotor itself as by mounting on indication means such as the shaft 50 thereto, by a mirror mounted thereon or other means dependent on the end use application of the device.

The transducer 26 includes a cup-shaped member 52 suitably secured to the crossbar 38 via a base surface 54 thereof by any suitable means such as an adhesive. The cup-shaped member 52 is generally semi-circular and the major upstanding arcuate surface 56 thereof is interiorly provided with a resistance surface or strip 58. The resistance surface 58 in effect forms a fixed EMF reference against which a contact arm 60 is adapted to slidably contact. The contact arm 60 is formed of suitable electrical conductive material, is preferably thin and springy and is biased towards the resistance surface so as to assure constant contact along the resistance surface 58 at all times. The other end of the contact 60 is suitably attached to a circular hub 62 in turn connected to the shaft 50. The hub 62 is generally of disclike shape and presents an arcuate surface 64 which is concentrically spaced from the resistance surface 58.

In order to connect the contact 60 thereto, a pin 64 is suitably driven into and secured to the body of the hub 62 such that at least a portion thereof is flush or extends outwardly of the arcuate surface 64. The other end of the contact 60 can then be disposed over that portion of the pin and suitably secured thereto as by soldering, brazing and the like. Simultaneously with such connection a lead L2 is electrically connected to the contact 60. Additionally, leads L1 and L3 are suitably connected as by solder to opposite ends of the resistance surface 58 and these leads L1 through L3 are then operationally connected to the comparator 28, the insulators 48 being utilized for this purpose.

Furthermore, in order that the induced movement of the coil 44 and accordingly the shaft 50 and the hub 62, will not cause either an electrical or mechanical vibration in contact 60, that portion of the arcuate surface 64 proximal to the connection with the contact 60 is packed with a viscous damping material 66 such as a silicon grease such that the material 66 bridges both adjacent surfaces. Thus, as the wiper arm 60 moves across the resistance surface 58, its spring bias towards the surface 58 assures contact therewith at all times and the presence of the viscous damping material 66 assures that any vibration set up in the contact arm 60 will be reduced or eliminated. In operation then, the transducer 26 sets up a null or servo feedback circuit such that the reference signal VF created by the potentiometric wiper effect of the contact arm and the resistance surface 58 is fed to the comparator 28 and therein compared to the input signal Vr. A difference between these signals represents an error and may be used to create an error signal which in turn may be utilized to correct the actual position of the shaft 50 so that the indicia I is truly representative of the input signal and not one caused by inertial effects, etc.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims. For example, the resistance surface 58 could be formed as a part of the peripheral surface of the hub 62 and the contact arm 60 mounted in opposition thereto from an independent member (not shown) positioned in place of or forming a part of the cup-shaped member 52. In such case, the position signal will be created by the movement of the resistance surface 58 rather than the contact arm 60, which in turn would be positioned radially outwardly of the rotating hub. The contact arm 60 is, however, still preferably mounted in an acute angular attitude to its supporting surface and the viscous damping material 66 introduced in the area bridging the contact and its supporting surface. In such cases there is no need, however, that the contact arm supporting surface be arcuate as in the embodiment shown. Also, in either the construction depicted in the drawing or in the immediately above indicated alternative, the resistance surface 58 may be in the same general plane as the contact arm rather than in angular opposition thereto and accordingly wipe across its planar surface in general parallel disposition. It is also possible in the illustrated embodiment to replace the cup-shaped member with one of a straight wall configuration, that is, its upstanding surface 56 being straight. In such case the contact arm would necessarily be hinged or otherwise modified to insure constant wiping contact with the resistance surface 58.

What is claimed is:

1. A device having a closed loop servo system for indicating the relative strength of an electrical input signal, such system including a limited rotation motor having a permanent magnet and a rotor movable through a magnetic field created thereby, and an electrical winding through which is passed an electrical current thereby creating an opposing magnetic field to change the position of said rotor, means for feeding an input signal to said electrical winding to induce movement in said rotor, transducer means adapted to sense the position of said rotor and to convert said position into an electrical position signal proportional to said rotor position relative to the maximum rotational limits thereof, comparator means for comparing said signals with each other and to correct the position of said rotor and indicating means operatively associated with said rotor to indicate the variations of said corrected input signal, said transducer means comprising a member having an arcuate resistance surface, a spring contact element connected in an acute angular relation to a supporting surface and adapted for relative reciprocal rotation with respect to said resistance surface and electrically connected to said comparator means to close such servo loop, said spring contact element adapted to wipe across said resistance surface upon rotation of said rotor to create said position signal, and a generally non-migratory viscous material in bridging contact with said spring contact element and a portion of the said supporting surface to which said spring contact element is connected for dampening vibration of said spring contact element as it moves across said resistance surface.

2. The device of claim 1, wherein said motor is a galvanometer and said rotor is the moving coil of said galvanometer.

3. The device of claim 2, wherein said moving coil is shaft mounted and a hub mounted to said shaft and rotatable therewith.

4. The device of claim 3, wherein said spring contact element is connected to said hub.

5. The device of claim 1, including a hub mounted to said rotor and rotatable therewith, said spring contact element connected to said hub.

6. The device of claim 1, including a hub mounted to said rotor and rotatable therewith, said resistance surface forming a peripheral portion of said hub.

7. The device of claim 1, said viscous material being a silicon grease.

8. The device of claim 4, said hub being a circular disc, a cup-shaped member having an upstanding arcuate surface concentrically opposed to and radially outwardly spaced from said hub, said resistance surface supported by said cup-shaped member.

9. The device of claim 8, said hub having a metal pin mechanically disposed therein, a surface of said pin extending from said hub, said spring contact element electrically and mechanically connected to said pin surface.

10. The device of claim 9, said spring contact element being soldered to said pin.

* * * * *